(12) United States Patent
Crozier et al.

(10) Patent No.: US 7,827,472 B2
(45) Date of Patent: Nov. 2, 2010

(54) PUNCTURE-CONSTRAINED INTERLEAVING FOR CONCATENATED CODES

(75) Inventors: Stewart N. Crozier, Boulder, CO (US); Kenneth Gracie, Ottawa (CA); Ron Kerr, Kanata (CA)

(73) Assignee: Her Majesty the Queen in right of Canada, as represented by the Minister of Industry, through the Communications Research Centre Canada, Ottawa, Ontario (CA)

( * ) Notice: Subject to any disclaimer, the term of this patent is extended or adjusted under 35 U.S.C. 154(b) by 529 days.

(21) Appl. No.: 11/753,924

(22) Filed: May 25, 2007

(65) Prior Publication Data

US 2007/0288834 A1 Dec. 13, 2007

Related U.S. Application Data

(60) Provisional application No. 60/803,299, filed on May 26, 2006.

(51) Int. Cl.
*H03M 13/03* (2006.01)
*G06F 11/00* (2006.01)

(52) U.S. Cl. .................. 714/790; 714/787; 714/788; 714/701

(58) Field of Classification Search .............. 714/787, 714/788, 790, 701
See application file for complete search history.

(56) References Cited

U.S. PATENT DOCUMENTS

| | | | |
|---|---|---|---|
| 5,446,747 A | 8/1995 | Berrou | |
| 6,961,388 B2 * | 11/2005 | Ling et al. | 375/267 |
| 7,210,075 B2 | 4/2007 | Ferrari et al. | |

FOREIGN PATENT DOCUMENTS

CA 2348941 11/2001

OTHER PUBLICATIONS

Min-Goo Kim; On systematic punctured convolutional codes, IEEE Transactions on Communications, vol. 45, Issue 2, Feb. 1997 pp.133-139.*

Mugaibel, A.H.; Kousa, M.A.; Evaluation of transfer functions for punctured turbo codes, Electronics Letters, vol. 36, Issue 9, Apr. 27, 2000 pp. 805-807.*

Weiliang Xie; Junxiong Tang; Rate compatible punctured turbo code scheme over optical wireless channel, IEEE International Conference on Communications, vol. 5, May 11-15, 2003 pp. 3130-3134 vol. 5.*

(Continued)

*Primary Examiner*—Joseph D Torres
(74) *Attorney, Agent, or Firm*—Allen, Dyer, Doppelt, Milbrath & Gilchrist, P.A.

(57) ABSTRACT

The invention relates to an encoding system and method for generating concatenated codes which utilize interleaving and data puncturing. The method includes selecting first and second puncture location sets defining desired puncture locations in non-interleaved and interleaved data sequences, respectively. A puncture-constrained interleaver is provided, which permutes the first puncture location set into the second puncture location set, so as to provide desired regular puncture patterns for all constituent codes. In a preferred embodiment, the puncture-constrained interleaving alters a symbol location relative to a puncture mask so as to satisfy a predefined spread or distance constraint.

17 Claims, 9 Drawing Sheets

OTHER PUBLICATIONS

Crozier, "New High-Spread High-Distance Interleavers for Turbo-codes", 20th Biennial Symposium on Communications, Kingston Ontario, Canada, pp. 3-7, May 28-31, 2000.

I. Land et al, "Partially Systematic Rate 1/2 Turbo Codes", 2nd International Symposium on Turbo Codes, Brest, France, pp. 287-290, Sep. 4-7, 2000.

Crozier et al, "Distance Upper Bounds and True Minimum Distance Results for Turbo-Codes Designed with DRP Interleavers", 3rd International Symposium on Turbo Codes, Brest, France, pp. 169-172, Sep. 1-5, 2003.

Chatzigeorgiou et al, "Punctured Binary Turbo-Codes with Optimized Performance", Proceedings of the 62nd IEEE Vehicular Technology Conference (VTC Fall 2005), Dallas, USA, Sep. 25-28, 2005.

* cited by examiner

Non-interleaved sequence of symbols $d_i$, where $i$ – symbol position in the sequence, puncture mask (10)

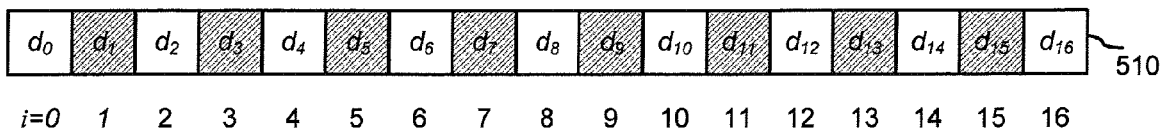

Interleaved sequence of symbols $d_{I(j)}$, where $I(j)$ – symbol position in the sequence, puncture mask (1100)

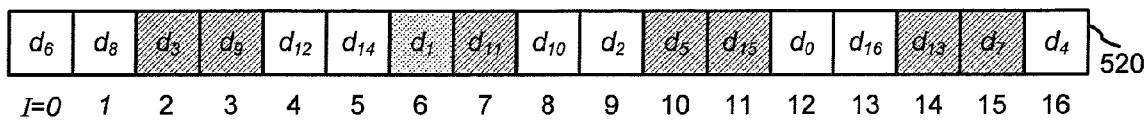

Puncture locations in the non-interleaved sequence

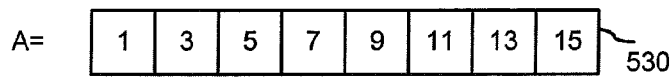

Puncture locations in the interleaved sequence

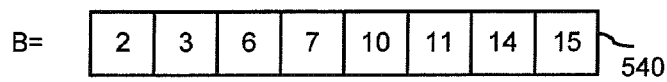

Set of all non-punctured symbol locations in the interleaved sequence

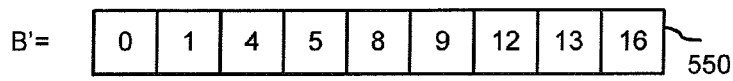

FIG. 6

PUNCTURE-CONSTRAINED INTERLEAVING FOR CONCATENATED CODES

CROSS-REFERENCE TO RELATED APPLICATIONS

The present invention claims priority from U.S. Provisional Patent Application No. 60/803,299 filed May 26, 2006, entitled "Method and System of Interleaving for Turbo and Turbo-like Codes with Puncturing", which is incorporated herein by reference.

TECHNICAL FIELD

The present invention generally relates to digital communications, and more particularly to methods of data encoding utilizing data interleaving and puncturing, and to encoders implementing such methods.

BACKGROUND OF THE INVENTION

Turbo codes have received considerable attention since their introduction in 1993. This is due to their powerful error correcting capability, reasonable complexity, and flexibility in terms of accommodating different block lengths and code rates.

FIG. 1 illustrates one common turbo-code encoder that uses two recursive systematic convolutional (RSC) encoders 100 and 104 operating in parallel, with the RSC encoder 104 preceded by an interleaver 102, and a puncturing unit 106. The same data bits $d_i = d(i)$, i.e. information bits plus possible overhead bits such as error detection and trellis termination bits, with the index i indicating bit location in a data bit sequence, are fed into two RSC encoders 100, 104, but the interleaver 102 permutes, i.e. re-orders the data bits according to a pre-determined interleaving rule before passing the data symbols/bits to the RSC encoder 104. Encoders 100 and 104 generate parity symbols $p_1(i)$ and $p_{,2}(i)$ which are provided to the puncturing unit 106. The puncturing unit 106 punctures the parity symbols generated by the RSC encoders and, optionally, some of the source data symbols. The source symbols $d_i$ and corresponding punctured parity symbols $p_1(i)$ and $p_{,2}(i)$ generated by the encoders 100 and 104 form encoded code words which are provided to a modulator, which is not shown. The turbo code codewords consist of one set of data bits and the two sets of parity bits generated by the two RSC encoders 100, 104. Assuming rate 1/2 constituent codes, the nominal overall code rate, without any puncturing, is 1/3. The puncturing unit 106 is used to achieve higher code rates by removing some of the data and/or parity symbols from the codewords.

The decoding process is typically performed in an iterative manner by exchanging soft information, often called extrinsic information, between two constituent RSC decoders corresponding to the RSC encoders 100 and 104, with one of the two constituent decoders preceded by the interleaver to decode the interleaved code generated by the RSC decoder 104. Each constituent decoder uses a soft-in/soft-out (SISO) algorithm such as the Bahl, Cocke, Jelinek and Raviv (BCJR) algorithm well known in the art. Versions of this algorithm are also referred to as the maximum a posteriori probability (MAP) algorithm or more precisely, in the context of soft iterative decoding, as the a posteriori probability (APP) algorithm. These algorithms and their log-domain variations, often referred to as the log-MAP, log-APP, max-log-MAP and max-log-APP algorithms, are discussed, for example, in a paper by P. Robertson, E. Villebrun, and P. Hoeher, entitled "A Comparison of Optimal and Suboptimal MAP Decoding Algorithms Operating in the Log Domain", Proceedings of the IEEE International Conference on Communications, June 1995, pp. 1009-1013.

Turbo code error rate performance is typically characterized by two important regions, namely the waterfall region and the error flare region in an error-rate vs. signal-to-noise ratio (SNR) curve. The waterfall region is associated with low to moderate SNR values. In this region, the slope of the error-rate curve drops rapidly as the SNR increases. The error flare region is associated with moderate to high SNR values. In this region, the error-rate curve suffers from flattening or flaring, making it difficult to further improve the error rate performance without a significant increase in the SNR.

Interleaving is a practice well known in the art. It is a method of arranging or permuting elements within a block. In a turbo-code encoder the elements are typically data bits or data symbols. In a turbo-code decoder the data elements are typically soft data samples from the receiver.

Interleaving is a key component of turbo codes, and interleaver strategy plays a critical role in determining code performance. This is true for both Turbo Code classes, i.e., Parallel Concatenated Convolutional Code (PCCC) disclosed in U.S. Pat. No. 5,446,747 and illustrated in FIG. 1, as well as for Serially Concatenated Convolutional Code (SCCC). In both cases block interleavers are typically used, as the data stream is divided into blocks of finite size before performing the encoding and decoding operations.

Interleavers can be defined and implemented in a number of different ways. FIG. 2 illustrates a definition used herein. The interleaver reads from a vector 108 of input symbols or samples, $d_{in}$, and writes to a vector 111 of interleaved or permuted output samples, $d_{out}$. The input samples 108 are read using read indexes i=0 ... K−1, where K is the interleaver length. The interleaver vector I defines the order in which the samples from the input vector 108 form the output vector 111. That is, the i-th input, read from location i in the input vector 108 is written to location I(i) in the output vector 111. The interleaver is completely defined by the write vector I. The elements being interleaved can be symbols used in an encoder, such as standard bits, or they can be signal samples or soft reliability values corresponding to transmitted symbols in a decoder. To be general, the symbols or samples will simply be referred to as elements. It is understood that interleavers are required in both encoders and decoders and that the term interleaver is also used to refer to a de-interleaver.

FIG. 3 illustrates components of a conventional interleaver 102 in the context of the turbo encoder. The input of the interleaver is stored in a memory 110, which is at least as large as the interleaver block size, i.e. K symbols. An indexing engine 112 re-orders the symbols stored in the memory 110 according to the order provided by the indices 114. The re-ordered symbols are stored in memory 116 and provided as output. In some cases the interleaver can provide the re-ordered symbols directly without the need for having both memory 110 and 116.

Two common interleaver types are the "random" interleaver and the so-called "S-random" or "spread" interleaver. The term "interleaver spread" refers to a spacing between symbols before and after interleaving in the data sequence. It is known in the art that good spreading properties of an interleaver are desirable for both fast convergence during iterative decoding and good distance properties between codewords generated by the encoder. A high codeword, e.g. Hamming, distance is desirable for both lowering the error flare and for making the flare region of the BER vs. SNR curve as steep as possible. Hamming distance is the minimum number of symbols that must be changed in a code word for a first codeword to become a second codeword. The further apart two codewords are, the more a signal can be corrupted while retaining the ability for the decoder to properly decode the message. It is also important to reduce the number of codewords at or near the minimum distance.

Examples of known high-spread interleavers include dithered golden interleavers, and low extrinsic correlation interleavers. A high-spread random (HSR) interleaver which provides excellent performance results is disclosed in a paper entitled "New High-Spread High-Distance Interleavers for Turbo-codes" presented at 20th Biennial Symposium on Communications, Kingston Ontario, Canada, pp. 3-7, May 28-31, 2000 by S. Crozier, an inventor of the current invention, and in Canadian Patent Application No. 2,348,941 issued to S. Crozier, which are incorporated herein by reference. Efficient high-spread interleavers with reduced memory requirements are dithered relative prime (DRP) interleavers, which are disclosed in U.S. Pat. No. 6,857,087 issued to S. Crozier and assigned to the assignee of the instant application, which is incorporated herein by reference. The HSR and DRP approaches use a definition of spread which differs from that typically used to design S-random interleavers, and is more closely related to the distance properties of Turbo-codes; see e.g. U.S. Pat. No. 6,857,087 for more details.

The term 'data puncturing' as used herein means that in the output of the turbo encoder some of the data symbols have been punctured, i.e. dropped, instead of puncturing just the parity symbols. This means that the turbo code is no longer a systematic code, but is only partially systematic. The most common puncturing method is to only puncture the parity symbols, but promising performance has also been obtained with limited puncturing of the data symbols.

Data puncturing that provides an overall punctured code rate of 1/2 has been investigated in a paper by I. Land and P. Hoeher, entitled "Partially Systematic Rate 1/2 Turbo Codes", presented at 2nd International Symposium on Turbo Codes, Brest, France, pp. 287-290, Sep. 4-7, 2000, which is incorporated herein by reference. The results disclosed by Land and Hoeher showed, however, only a modest improvement in performance with data puncturing. This was partly due to the fact that only random interleavers were investigated, with no other constraints placed on the interleavers to optimize the overall code performance. Results for 8 and 16-state RSC encoders for higher code rates with data puncturing are disclosed in U.S. Pat. No. 6,857,087 to S. Crozier and P. Guinand, and a paper by S. Crozier and P. Guinand, "Distance Upper Bounds and True Minimum Distance Results for Turbo-Codes Designed with DRP Interleavers", 3rd International Symposium on Turbo Codes, Brest, France, pp. 169-172, Sep. 1-5, 2003, where it is shown that by improving the interleaver design, a more significant improvement can be achieved in error flare performance for encoders with data puncturing.

The code rate of a turbo code with puncturing is given by $$R=1/(R_0+R_1+R_2) \quad (1)$$

where $R_0=N_0/D_0$ is the data throughput rate, $R_1=N_1/D_1$ is the first parity (par1) throughput rate, $R_2=N_2/D_2$ is the second parity (par2) throughput rate.

Typically, puncturing is performed using relatively short repeating puncture masks for each of the data and parity streams. Each mask contains a sequence of 0's and 1's where, by convention, a '1' indicates a selected, or kept, bit and a '0' indicates a punctured, or removed, bit. The denominators, $D_0$, $D_1$ and $D_2$, represent the lengths of the puncture masks and the numerators, $N_0$, $N_1$ and $N_2$, are the number of '1's in the masks. Without any puncturing $R_0=R_1=R_2=1$ and $R=1/3$. If by way of example a code rate of $R=2/3$ is desired, without any data puncturing it might be obtained using repeating puncture masks of $(P_{data}, P_{par1}, P_{par2})=(1, 0100, 0010)$, where $P_{data}$ is the puncturing mask used for puncturing the data symbols, and $P_{par1}, P_{par2}$ are the puncture masks used for puncturing the first and second parity symbols generated by the encoders 100, 104 respectively. In this example, $N_0=1$, $D_0=1$, $N_1=1$, $D_1=4$, $N_2=1$ and $D_2=4$, which corresponds to puncturing, i.e. dropping 3 out of each 4 parity bits, which may be detrimental to error correction performance of the punctured code. This problem can be addressed by a small amount of data puncturing. Considering 1-in-4 data puncturing as an example, the code rate $R=2/3$ might be obtained using the repeating puncture masks of $(P_{data}, P_{par1}, P_{par2})=(0111, 10010010, 01001001)$, so that additional parity bit/symbols can be kept for potentially improved performance.

A small amount of data puncturing, in exchange for keeping more parity bits, can significantly improve the distance property of the resulting code and thus the flare performance. Intuitively, this is because most of the codeword distance, especially for the low input-weight codewords, tends to come from the parity bits. Therefore the better the interleaver design, i.e., the larger proportion of distance that comes from the parity symbols, the better data puncturing should work to improve the distance. It has also been found that the convergence, i.e. the waterfall region performance can also be improved with small amounts of data puncturing. However, puncturing too many data symbols can significantly degrade the convergence performance. Further, too much data puncturing can also cause catastrophic effects and worsen distance properties of the punctured codeword and thus degrade error flare performance.

One problem with puncturing of data symbols in prior art turbo codes with conventional interleaver designs is an effective "scrambling" of the puncturing mask associated with the second code by the interleaver. That is, the interleaver 102 in effect permutes the repeated data puncture mask used for the first code, which may result in sub-optimal data puncturing for the second code. Moreover, since most high-performance turbo code interleavers utilize random or pseudo-random permutation rules, the data puncturing associated with the second encoder 104 usually has a random nature. With the effectively random data puncturing, the distance properties and soft decoding properties associated with the second constituent decoder which decodes interleaved data are difficult to predict, control, and/or optimize, and catastrophic or near catastrophic puncturing might occur if several punctured data symbols get interleaved close together.

Recently, I. A. Chatzigeorgiou, M. R. D. Rodrigues, I. J. Wassell and R. Carrasco in a paper entitled "Punctured Binary Turbo-Codes with Optimized Performance", published in Proceedings of the 62nd IEEE Vehicular Technology Conference (VTC Fall 2005), Dallas, USA, Sep. 25-28, 2005, tried to address this problem by disclosing an l-bit periodic random interleaver that imposes a puncture mask related constraint on symbol positions in the interleaved sequence; namely, if l is the length of the data puncturing pattern $P_d$, the l-bit periodic random interleaver of Chatzigeorgiou et al maps the data puncturing pattern $P_d$ into the same pattern $P_d$, by permuting i-th symbol of the input sequence of data symbols to one of a symbol locations (i+nl) in the interleaved sequence, where n is a random integer number.

The encoding method disclosed by Chatzigeorgiou et al, although solving the problem of interleaver-induced catastrophic or near-catastrophic puncturing, has however significant drawbacks and undesirable limitations. First, the encoder of Chatzigeorgiou et al utilizes homogeneous puncturing patterns, wherein the puncturing bits are uniformly distributed among the systematic, i.e. data, and the parity streams of the turbo encoder. This limits the highest achievable code rate to 2/3, which is an undesirable limitation disadvantageously affecting the codes' information efficiency. Second, the encoding method of Chatzigeorgiou et al imposes unnecessarily strict limitations on the interleaver design, thereby severely limiting the choice of interleavers, and making it difficult to find an interleaver providing good spread and distance properties, and fast convergence of the decoding process.

Accordingly, an object of this invention is to provide a method of encoding utilizing data puncturing and an improved puncture-constrained interleaving for providing enhanced error correction and decoding convergence performance, and an encoder utilizing said method.

SUMMARY OF THE INVENTION

In accordance with the invention, a method is provided for encoding an information-bearing signal using symbol puncturing and interleaving for use in encoding systems for generating concatenated codes. The method comprises the following steps:

a) receiving a sequence of K data symbols representing the information bearing signal, wherein K is at least 2;

b) selecting a first puncture mask of length $D_0$ defining a puncture location set A of desired symbol puncture locations in the sequence of data symbols;

c) selecting a second puncture mask of length D defining a puncture location set B of desired symbol puncture locations in a sequence of permuted data symbols;

d) performing a puncture-constrained interleaving of the sequence of K data symbols for forming the sequence of permuted data symbols;

e) encoding the sequence of permuted data symbols to obtain a first sequence of parity symbols;

f) puncturing one of: the sequence of K data symbols according to the puncture location set A, and the sequence of permuted data symbols according to the puncture location set B, for forming a punctured sequence of data symbols; and, g) utilizing the punctured sequence of data symbols and the first sequence of parity symbols to obtain an encoded signal comprising error correction information;

wherein step (d) is performed so as to permute the first puncture location set A into the second puncture location set B, and to alter a relative symbol position with respect to a puncture mask of length M, wherein M is the least common multiple of $D_0$ and D, for at least one of the data symbols, so that (i modulo M) is not equal to (I(i) modulo M) for at least one data symbol location i=i' in the sequence of data symbols and a corresponding data symbol location I=I(i') in the sequence of permuted data symbols.

Another aspect of the invention provides an encoding system utilizing symbol puncturing and the puncture-constrained symbol interleaving. The encoding system provided by the invention comprises an input port for receiving a sequence of K data symbols; a first memory for storing puncture location information defining one of: a first puncture mask of length M defining a puncture location set A of desired symbol puncture locations in the sequence of data symbols, and a second puncture mask defining a puncture location set B of desired symbol puncture locations in a sequence of permuted data symbols; a puncture-constrained interleaver operatively coupled to the input port for forming a sequence of permuted data symbols from the input sequence of K data symbols according to a pre-defined permutation rule.

The pre-defined permutation rule according to the invention comprises: permuting the first puncture location set A into the second puncture location set B, and altering a relative symbol position with respect to the first puncture mask for at least one of the data symbols, so that for at least one data symbol location i=i' in the sequence of K data symbols and a corresponding data symbol location I=I(i') in the sequence of permuted data symbols, (i modulo M) is not equal to (I(i) modulo M).

The encoding system further comprises a second memory for storing interleaver information defining permuted data symbol location I(i) for each data symbol location i=0, ..., K−1 in the sequence of K data symbols; a first encoder coupled to the puncture-constrained interleaver for producing a first sequence of parity symbols from the sequence of permuted data symbols; a puncturing unit operatively coupled to the first memory for removing data symbols from one of the sequence of K data symbols and the sequence of permuted data symbols at locations defined by the puncture location information stored in the first memory; and, an output port operatively coupled to the puncturing unit for providing an encoded punctured output signal comprising error correction information.

Another aspect of the invention provides a method for generating or decoding punctured concatenated codes. In this aspect of the invention, the method comprises the following steps: selecting puncture location sets A and B of desired data puncture locations in an input sequence of K data symbols and a sequence of permuted data symbols, respectively, wherein the puncture location sets A and B correspond to pre-defined puncture masks of length M;

generating a set of K interleaver values I={I(i)}, wherein i=0, ..., K−1, which relates symbol locations I(i) in the sequence of permuted data symbols to respective symbol locations i in the input sequence of K data symbols in dependence upon the puncture location sets A and B, so as to satisfy the following two conditions:

I(i) is an element of the puncture location set B if i is an element of the puncture location set A, and (i modulo M) is not equal to (I(i) modulo M) for at least one data symbol location i=i' in the input sequence of K data symbols;

storing the set of K interleaver values I, or information defining thereof, in memory; and, permuting each received sequence of K data symbols according to the set of interleaver values I.

BRIEF DESCRIPTION OF THE DRAWINGS

The invention will be described in greater detail with reference to the accompanying drawings which represent preferred embodiments thereof and in which like numerals represent like elements, and wherein:

FIG. 6 is a diagram illustrating data structures used in the puncture-constrained interleaving of the present invention;

DETAILED DESCRIPTION

The following general notations are used in this specification: the notation $x(i)$ or $x_i$ denotes an i-th element of a vector x, with the index 'i' representing a time sample, or the element location in a sequence of elements represented by the vector x. The notation $\{x(i)\}_K$ represents a set of all elements of a vector x of length K, and also an ordered sequence of the elements $x(i)$, $i=0, \ldots, K-1$, where K is the length of the sequence. In the context of this specification this vector notation will be used to represent ordered sequences of symbols, so that an i-th symbol $x(i)$ in a sequence $\{x(i)\}_K$, $i=0, \ldots, K-1$, will also be referred to as the i-th element of a vector x representing said sequence, so that $x=\{x(i)\}_K$. The subscript "K" in the sequence notation $\{x(i)\}_K$ will be omitted where possible without loss of clarity. The notation $mod(x,y)$ denotes x modulo-y arithmetic, so that by way of example, $mod(5,4)=1$ and $mod(4,4)=0$.

In addition, the following is a partial list of abbreviated terms and their definitions used in the specification:

ASIC Application Specific Integrated Circuit
BER Bit Error Rate
PER Packet Error Rate
SNR Signal to Noise Ratio
DSP Digital Signal Processor
FPGA Field Programmable Gate Array The instant invention provides method and system for encoding an information bearing signal with a punctured concatenated code utilizing puncture-constrained interleaving of data symbols. Another aspect of the current invention provides a method for puncture-constrained interleaving for generating punctured concatenated codes. The invention is applicable to methods and systems for generating both serially and parallel concatenated codes, and mixed-type concatenated codes having both serial and parallel components.

Figure 4A:
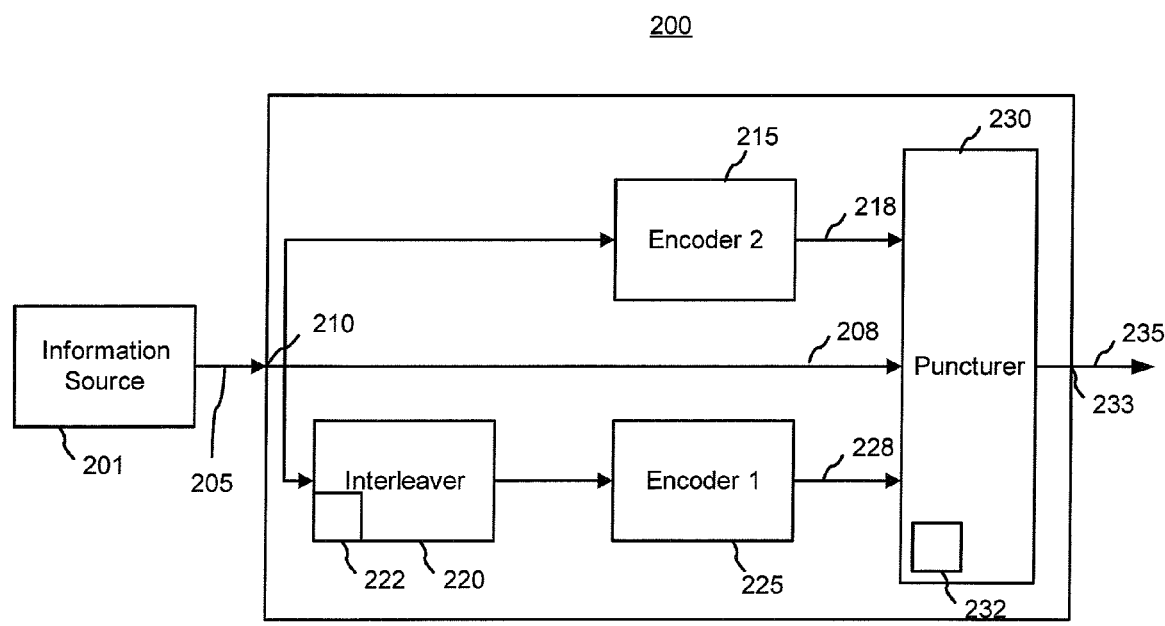
FIG. 4A is a diagram of an encoding system utilizing puncture-constrained interleaving of the present invention for generating a parallel concatenated code.
Figure 4B:
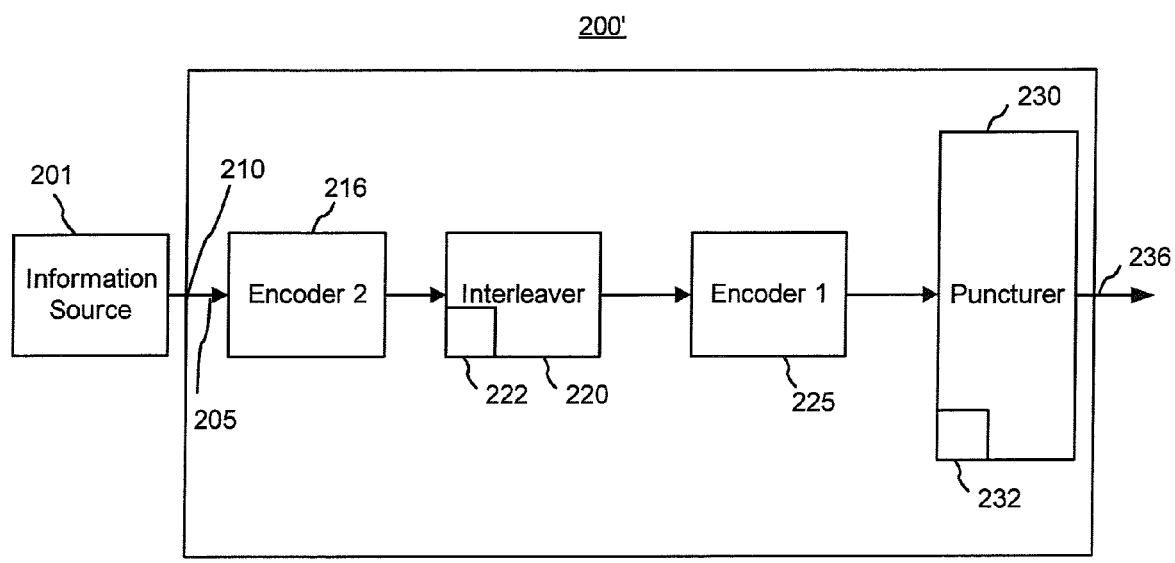
FIG. 4B is a diagram of an encoding system utilizing puncture-constrained interleaving of the present invention for generating a serially concatenated code.

Exemplary embodiments of the encoding system and method of the current invention will now be described primarily with reference to a turbo encoder 200 for generating a parallel concatenated code, which diagram is schematically illustrated in FIG. 4A, although the invention equally applies to a turbo-like encoder 200' of FIG. 4B for generating a serially concatenated code. The various functional units shown as blocks in FIG. 4A can be integrated or separate structures implemented in either software or hardware or a combination thereof commonly known to provide their respective functionalities, including general purpose processors, DSPs, ASICs, and FPGAs. The functional units of the turbo encoder 200 are adopted to perform one or several steps of the encoding method of the present invention utilizing puncture-constrained data interleaving. These steps will be described hereinbelow with reference to FIGS. 5-9 illustrating the encoding and interleaving methods of the present invention.

Turning first to FIG. 4A, the turbo encoder 200 includes first and second constituent encoders 225 and 215, a puncture-constrained interleaver 220 and a puncturing unit 230 which also functions as a multiplexer. The puncturing unit 230 and the puncture-constrained interleaver 220 include memory blocks 232 and 222, which are hereinafter also referred to as first and second memory, respectively. In other embodiments, the memory blocks 222 and 232 can be embodied as two separate units or as a single memory unit operatively coupled to the interleaver 220 and the puncturing unit 230.

In operation, the turbo encoder 200 receives from an information source 201 via an input port 210 an information-bearing digital signal 205 in the form of a stream of data symbols, processes this stream of data symbols in data blocks of K symbols each in accordance with the interleaver length, said data blocks hereinafter referred to as input sequences of data symbols d, and outputs an encoded signal 235 including added error-correction information through an output port 233 operatively coupled to the puncturing unit 230. The puncture-constrained interleaver 220 is operatively coupled to the input port 210 of the turbo encoder 200 for forming a sequence of permuted data symbols $d_I$ from each input sequence of K data symbols d according to a pre-defined puncture-constrained permutation rule, which preferably includes altering a symbol position with respect to a puncture mask for at least one of the data symbols so as to satisfy a spread or distance constraint as described hereinbelow. The sequences of data symbols d and $d_I$ will be also referred to hereinafter as the non-interleaved and interleaved data sequences, which respectively form the input and output sequences of the interleaver 220.

For the purpose of illustration, the first and second constituent encoders 225, 215 are assumed to be rate ½ RSC encoders which in operation generate first and second sequences $par_1$ 228 and $par_2$ 218 of parity symbols, respectively, for each sequence of data symbols d received by the turbo encoder 200. Each of the symbol sequences d, $par_1$ and $par_2$ are of a same length, i.e. have a same number of elements which is defined by the interleaver length K. In other embodiments, the number of elements in the sequences of parity symbols $par_1$ and $par_2$ can differ from the number K of elements in the data sequence d, and the rate of encoders 215 and 225 can differ from ½.

The puncturing unit 230 punctures each received sequence of data symbols d 208 in accordance with a desired puncture mask $P_A$, which is hereinafter referred to as the first puncture mask, and is stored in the first memory 232. Optionally, it can also puncture the first and second sequences of parity symbols $par_1$ 228 and $par_2$ 218 prior to multiplexing thereof with a punctured data sequence to form the encoded signal 235.

Figure 1:
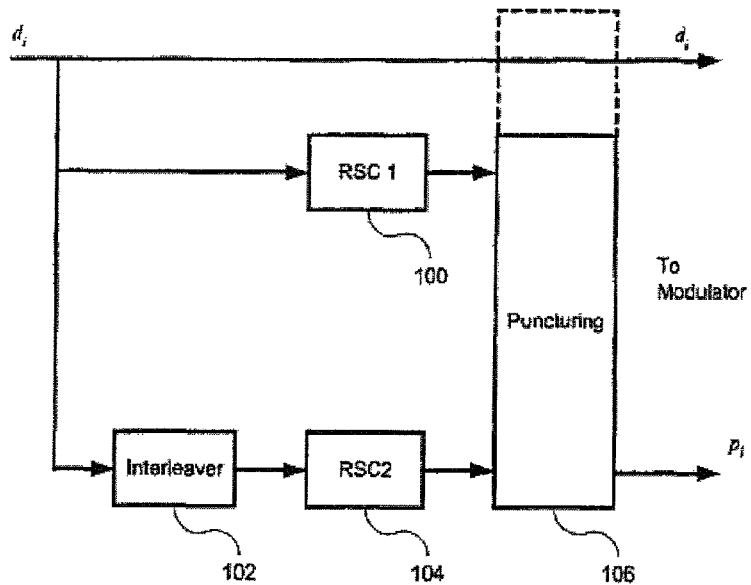
FIG. 1 is a diagram illustrating a prior art turbo-code encoder with two recursive systematic convolutional encoders.
Figure 2:
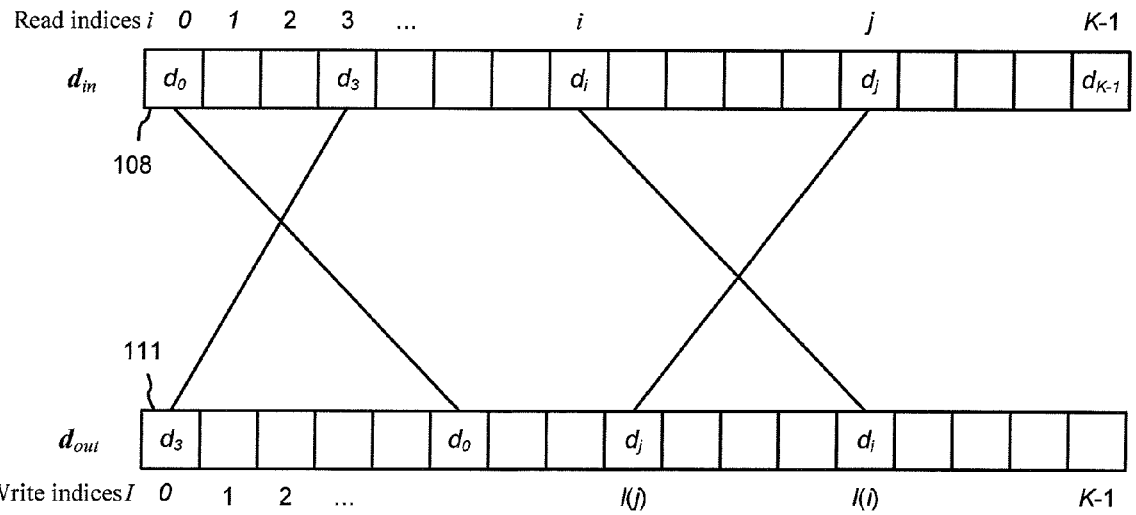
FIG. 2 is a general diagram illustrating the operation of a prior art interleaver.
Figure 3:
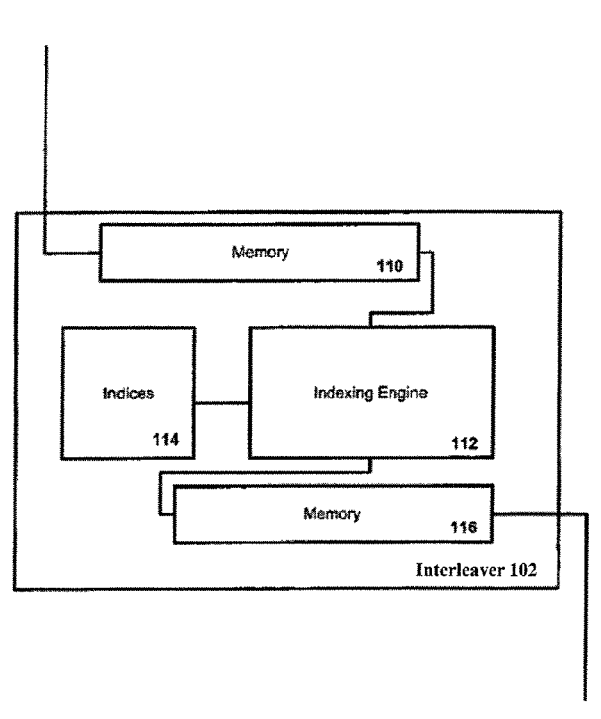
FIG. 3 is a schematic diagram of a prior art interleaver.

The puncture-constrained interleaver 220 is functionally defined by an interleaver vector I, which elements form a set of K interleaver values I(i), $i=0 \ldots K-1$, each interleaver value I(i) defining a location in the sequence of permuted data symbols $d_I$ for a data symbol having a symbol location i in the sequence of data symbols d, as illustrated in FIGS. 2 and 6; the symbol location I(i) is also referred to herein as the permuted symbol location. Information defining the set of interleaver values $I=\{I(i)\}_K$ is stored in the second memory 222. Without any loss of generality, it is assumed herein that the i-th data symbol at the input of the interleaver 220, i.e. a data symbol read from location i in the non-interleaved input sequence of data symbols d, is written to location I(i) in a sequence of permuted data symbols $d_I$ at the output of the interleaver 220. The symbol locations i and I(i) are also referred to herein as indices of a symbol $d(i)=d_I(I(i))$ in the vectors d and $d_I$, with the index i referred to as the read index, and the index I=I(i) as the write index.

Some of the embodiments described hereinbelow utilize an interleaver spread constraint to generate the interleaver values I(i). The term "interleaver spread" used in this specification refers to a spacing between symbols in the sequences of data symbols d and $d_I$ before and after the interleaving. Good spreading properties of the interleaver are desirable for both fast convergence and good codeword distance properties of a respective turbo code using the interleaver. As one skilled in the art will appreciate, different spreading criteria disclosed in the art can be used in various embodiments of the current invention.

By way of example, in some of the embodiments described herein the interleaver spread S(i) associated with a read index i is computed according to the following formula:

$$S(i) = \min_{j, i \neq j}[|I(i) - I(j)| + |i - j|], \quad (2)$$

where the minimum is taken over all indices j=0 ... K−1 not equal to i. The overall interleaver spread S computed as $$S = \min_i[S(i)], \quad (3)$$

where the minimum is taken over all indices i=0 ... K−1.

In embodiments of the invention where the first encoder 225 and the second encoder 215 generate tail-biting constituent codes, the absolute differences in (2) should be computed in the tail-biting or circular sense as would be known to those skilled in the art, so that, for example |i−j|=1 if i=0 and j=K−1.

An exemplary embodiment of the encoding method of the present invention will now be described with reference to the flowchart of FIG. 5, wherein each block represents a general step of the method and can be implemented in software, hardware or a combination thereof as will become apparent to those skilled in the art from the description hereinbelow. Although the flowchart of FIG. 5 is particularly drawn to exemplify the generation of parallel concatenated codes and therefore directly relates to the turbo encoder 200 shown in FIG. 4A to which references will be primarily made, one skilled in the art will appreciate that main steps illustrated in FIG. 5 and described in detail hereinbelow are also applicable to encoding systems generating serially concatenated codes, such as the turbo-like encoder 200' shown in FIG. 4B.

Figure 5:
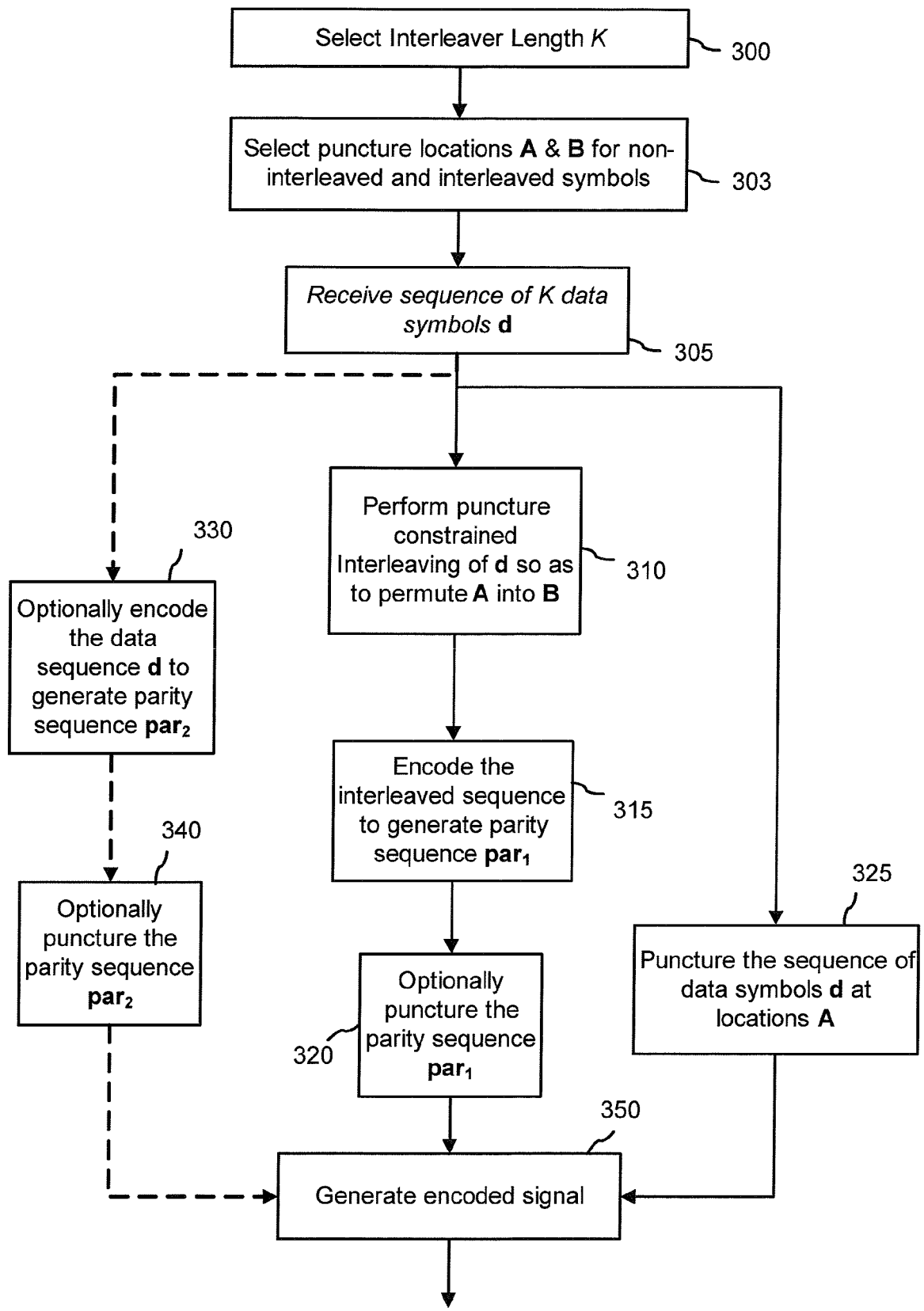
FIG. 5 is a flowchart illustrating general steps of the encoding method utilizing puncture-constrained interleaving.

In the embodiment shown in FIG. 5 the method starts with a step 300, wherein a suitable interleaver length K is selected as desired for a particular encoder implementation.

In a next step 303, desired puncture locations in the sequences of non-interleaved and interleaved data symbols are selected. This may include selecting the first puncture mask $P_A$ of length M, 1<M≦K, which defines a puncture location set A of desired symbol puncture locations in each sequence of K non-interleaved data symbols d, also referred to herein as the input sequence, and selecting a second puncture mask $P_B$ defining a puncture location set B of desired symbol puncture locations in a corresponding sequence of K interleaved data symbols $d_I$. As one skilled in the art will appreciate, the symbol puncture locations from the sets A and B can be viewed as the data puncture locations for the second and first constituent codes, respectively, of a final concatenated code, wherein in the context of this specification first code refers to a code generated by the first RSC encoder 225 that encodes interleaved data symbols, and the second code refers to a code generated by the second RSC encoder 215 that encodes non-interleaved data symbols. Either the first puncture mask $P_A$ or the second puncture mask $P_B$ is stored in the first memory 232 shown in FIGS. 4A and 4B, depending on whether the non-interleaved or interleaved sequence of data symbols is passed onto the puncturing unit 230; in the shown preferred embodiment, the puncturing unit 230 receives non-interleaved data 208, and the first puncture mask $P_A$ is stored in the first memory 232 for use by the puncturing unit 230.

Once the interleaver length and the puncture location sets are selected, a data encoding process starts in step 305 with receiving an input sequence d of K data symbols d(i), d={d(i)}. In most embodiments, the input sequence d of K data symbols is stored in the interleaver memory.

In a next step 310, a puncture-constrained interleaving of the stored input sequence of data symbols d is performed according to the present invention using an interleaving rule which permutes the first puncture location set A into the second puncture location set B. In other words, if a location i belongs to, i.e. is an element of, the first puncture location set A, then and only then a corresponding permuted location I(i) belongs to the second puncture location set B. This condition, which hereinafter will be referred to as the first constraint or the puncture constraint, can be described using the following symbolic equation:

$$I(A)=B, \quad (4)$$

wherein the notation I(A) denotes a set of all permuted locations I(i) with the read index i from the location set A. In a preferred embodiment, the puncture-constrained interleaving is performed so as to alter a symbol position relative to a respective puncture mask, as described hereinbelow in more detail.

In a step 315, the resulting sequence of permuted data samples $d_I$ is encoded by the first encoder 225 to generate a first sequence of parity symbols $par_1=\{par_1(i)\}$, i=0, ..., $K_1-1$, where $K_1$ is the number of parity symbols generated by the first encoder. In the exemplary embodiment of the turbo encoder generating a parallel concatenated code of rate 1/3 prior to puncturing, $K_1=K$. In other embodiments, $K_1$ can be larger or smaller than K. For example, alternative embodiments of the encoding method of the present invention may provide a serially concatenated code using an encoding system wherein the first and second encoders 225, 215 are concatenated in series, such as in the turbo-like encoder 200' schematically shown in FIG. 4B, wherein a second, or outer encoder 216 is operatively coupled between the input port 210 and the puncture-constrained interleaver 220. In one such embodiment, the sequence of K data samples d that is interleaved in step 310 may include K/2 information symbols and K/2 second parity symbols generated by an outer encoder, and the encoding performed by the first encoder 225 in step 315 may generate $K_1=K/2$ first parity symbols, so as to provide a rate 1/3 serial concatenated code before puncturing. In another embodiment wherein a serially concatenated code is generated, the sequence of K data symbols d that is interleaved in step 310 may consist exclusively of the second parity symbols generated by the outer encoder 216, with no systematic part being included in the final code passed to the puncture 230. Note that the first memory 232 in this case may store puncture location information defining either the first puncture mask $P_A$ or the second puncture mask $P_B$, depending on whether the non-interleaved or interleaved data sequence, i.e. d or $d_I$ is sent to the puncturer 230 for forming the serially encoded signal 236.

Turning back to FIG. 5, in a step 325, which is preferably but not necessarily performed in parallel with steps 310 and 315, the sequence of K data symbols d is punctured at symbol locations defined by the puncture location set A, producing thereby a punctured sequence of data symbols $d_p$. Alternatively, the punctured sequence of data symbols $d_p$ can be formed by puncturing the sequence of permuted data symbols $d_I$ at symbol locations defined by the second puncture location set B. In both cases, the punctured sequence of data symbols $d_p$, together with the first parity sequence $par_1$, is used in a following step 350 to generate the encoded signal 235 or 236 including error correction information, and the encoded signal can then be passed to a modulator for transmitting via a communication channel. The first parity sequence $par_1$ can also be punctured according to a desired parity puncture mask in step 320 prior to combining thereof with the punctured data sequence $d_p$ to form the encoded signal 235 or 236.

In the embodiment of the encoding method of the present invention that produces a parallel concatenated code, a second parity sequence $par_2$ of length K is generated in step 330 in parallel with generating the first sequence of parity symbols $par_1$ in step 315 by encoding the non-interleaved sequence of data symbols d, for example using the second rate 1/2 RSC encoding unit 215. The second parity sequence $par_2$ is then used in step 330 to form the encoded signal 235. In this embodiment, the encoded signal 235 may consist of a sequence of symbol blocks $S_{en} = \{d_p, par_1, par_2\}$, wherein the second parity sequence $par_2$ can optionally be also punctured at selected locations in step 340 prior to forming the encoded symbol block $S_{en}$ so as to increase the overall code rate.

Advantageously, the puncture-constrained interleaving performed in step 310 of the method of the present invention enables to control puncture patterns for both constituent codes generated by the first and second encoders, e.g. the encoders 225 and 215. By imposing suitable constraints on the interleaver design as described hereinbelow, good spread and distance properties can be ensured for codewords of the resulting punctured concatenated code at the output of the encoder 200.

The following examples illustrate one aspect of the puncture-constrained interleaving of the present invention, according to which the interleaver is selected so as to permute the first set of puncture locations A into the second predetermined set of desired puncture locations B.

EXAMPLES OF PUNCTURE-CONSTRAINED INTERLEAVING

In the following examples the data symbols are assumed to be binary and referred to as data bits.

Example 1

In this example, 1-in-M data bits from both the non-interleaved and interleaved data sequences d and $d_I$ are to be punctured, starting with the first bit in both sequences, and then puncturing every M-th bit in a regular repeating pattern. This corresponds to the same puncture masks $P_B = P_A = P$ of length M for the first and second codes, resulting in the same first and second puncture location sets $A = B = \{0, M, 2M, \ldots\}$ for both interleaved and non-interleaved data sequences. By imposing the following constraint (5) on the interleaver values I(i):

$$\mod(I(i), M) = 0 \text{ for all } i \text{ such that } \mod(i, M) = 0, \quad (5)$$

each element of the first puncture location set $A = \{0, M, 2M, \ldots\}$ after the interleaving becomes an element of the second puncture location set $B = \{0, M, 2M, \ldots\}$ providing puncture locations for the interleaved data. Note that even though the constraint $\mod(I(i), M) = \mod(i, M)$ holds for all read indices i from the first puncture location set A, this constraint is not imposed for other read indices that are not in A, i.e. which are not to be punctured. This is an important advantage of the current invention compared to the l-bit periodic interleaver of Chatzigeorgiou et al, which imposes a constraint equivalent to $\mod(I(i), M) = \mod(i, M)$ for all values of the read index i, which may disadvantageously affect achievable interleaver spread and codeword distance properties. The two examples below illustrate further advantages of the current invention, which relate to a much higher degree of flexibility in selecting data puncturing patterns provided by the current invention than that afforded by the l-bit periodic interleaver of Chatzigeorgiou.

In this exemplary embodiment, the puncturing of both the non-interleaved and interleaved data is performed using the same puncturing mask. This is however an unnecessary limitation, which as we found can lead to sub-optimal code performance, and in particular may result in a relatively slower convergence of the decoding process. Therefore, the following examples illustrate more preferred embodiments wherein puncture-constrained interleavers utilize differing puncture masks $P_B \neq P_A$ for the interleaved and non-interleaved data.

Example 2

In this second example, the desired puncture pattern is still 1-in-M data symbol puncturing, but starting at a location $a < M$ for the non-interleaved data, and at a location $b < M$ for the interleaved data, so that the first and second puncture location sets are $A = \{a, a+M, a+2M, \ldots\}$ and $B = \{b, b+M, b+2M, \ldots\}$, respectively. In order to permute the first set A into the second set B, the interleaver values I(i) must satisfy the following constraint:

$$\mod(I(i), M) = b \text{ for all } i \text{ such that } \mod(i, M) = a, \quad (6)$$

where a and b represent single elements from a set $C = \{0, 1, \ldots M-1\}$. In other words, if i is an element of the first set $A = \{a, a+M, a+2M, \ldots\}$, i.e. the punctured locations for the second code, then I(i) must be an element of the second set $B = \{b, b+M, b+2M, \ldots\}$, which effectively defines the punctured locations for the first code. Again, note that the constraint $\mod(I(i), M) = b$ is not imposed on read indices i, which are not in A.

Example 3

In this example, more general repeating data puncture patterns are described. Let the actual length of a repeating data puncture mask for the non-interleaved data be $D_0$ and let the desired length of the repeating data puncture mask for the interleaved data be D. Let M be the least common multiple (LCM) of $D_0$ and D, so that both masks can equivalently be considered to be of length M. Note that there is no loss in generality with this assumption since it does not affect the overall puncturing, which is defined by the first and second sets of puncture locations A and B. As in Example 2, define a set of indices $C = \{0, 1, \ldots M-1\}$ which define symbol locations within a puncture mask of length M. Let the first data puncture mask $P_A$ have m 0's at locations $a = \{a_1, a_2, \ldots a_m\}$, all unique elements of C, so that m-in-M data bits are punctured repeatedly. Similarly, let the desired second data puncture mask $P_B$ for the interleaved data have m 0's at locations $b = \{b_1, b_2, \ldots b_m\}$, all unique elements of C, so that m-in-M data bits will again be punctured repeatedly. With these definitions, the first and second puncture location sets are A={$a_1$, $a_1$+M, $a_1$+2M, ... $a_m$, $a_m$+M, $a_m$+2M, ...} and B={$b_1$, $b_1$+M, $b_1$+2M, ... $b_m$, $b_m$+M, $b_m$+2M, ...}. The puncture-constrained interleaver I of the present invention has interleaver values I(i) which satisfy the following condition:

$$\mod(I(i),M) \in b \text{ for all } i \text{ such that } \mod(i,M) \in a, \qquad (7)$$

where the notation x∈z means that x is an element of the vector, or set z.

When condition (7) is satisfied, I(i) is an element of the second puncture location set B if i is an element of the first puncture location set A, and the puncture-constrained interleaver permutes the first set A into the second set B. Arbitrary repeating data puncture masks of length M having m-in-M data puncturing can effectively be designed for both constituent codes of the turbo encoder by utilizing the constraint (7). Obviously, each of the conditions (5)-(7) corresponds to the first constraint (4) for a respective exemplary puncturing pattern described hereinabove.

A specific data puncturing example will now be described with reference to FIG. 6. In this example, we want to use two rate 1/2 repeating data puncture masks (10) and (1100) for the non-interleaved 510 and interleaved 520 vectors of length K=17, respectively, with vector 510 representing the input sequence of data symbols d and vector 520 representing the corresponding sequence of permuted data symbols $d_I$. The punctured symbol locations in the non-interleaved and interleaved vectors 510, 520 corresponding to repeating applications of the two puncture masks are indicated in FIG. 6 with patterned squares. The puncture mask applied to the non-interleaved vector 510 has length $D_0$=2 and the puncture mask applied to the interleaved vector 520 has length D=4. The length M=4 is the LCM of both mask lengths and C={0, 1, 2, 3}. Thus, we can equivalently assume that the first and second puncture masks $P_A$, $P_B$ are both of length M=4, with $P_A$=(1010) and $P_B$=(1100), where a={1, 3} and b={2, 3} define locations of '0's in the first and second puncture masks, respectively. The puncture location sets A={1, 3, 5, ...} and B={2, 3, 6, 7, ...} resulting from repetitious applications of the first and second puncture masks to the non-interleaved and interleaved sequences of data symbols are illustrated in FIG. 6 at 530 and 540, respectively.

The interleaver constraint (7) of the present invention becomes $$\mod(I(i),4) \in \{2,3\} \text{ for all } i \text{ such that } \mod(i,4) \in \{1,3\} \qquad (7')$$

In other words, in this exemplary embodiment the puncture-constrained interleaver of the present invention is such that if i is an element of set 530 A={1, 3, 5, ...}, the punctured locations for the second code, then I(i) must be an element of set 540 B={2, 3, 6, 7, ...}, the desired punctured locations for the first code.

In addition to satisfying constraint (7) relating the first and second sets A and B of the desired puncture locations, the puncture-constrained interleaving of the present invention is preferably performed so as to alter a relative symbol position with respect to a puncture mask for at least one, and more preferably for several of the data symbols. The term "relative symbol position with respect to a puncture mask" means a position of a particular data symbol within a respective application of the puncture mask to the symbol sequence.

Quantitatively, for a particular symbol having a location index j in a sequence of symbols to which a puncture mask of length M is repetitively applied, the relative symbol position within the puncture mask is defined by an integer parameter l(j)=mod(j,M).

Therefore, the puncture constrained interleaving of the present invention is preferably performed so as to satisfy the following second constraint:

$$\mod(i,M) \neq \mod(I(i),M) \qquad (8)$$

for at least one symbol location i=i' from the set{0, ..., (K−1)}.

This is illustrated by way of example in FIG. 6, where for a symbol location i=1 we have I(1)=6 and mod(i,M)=mod(1, 4)=1 is not equal to mod(I(i),M)=mod(6,4)=2, so that constraint (8) is satisfied for at least one location index i=1, for which the interleaving alters the relative symbol position l within the puncture masks.

Figure 7:
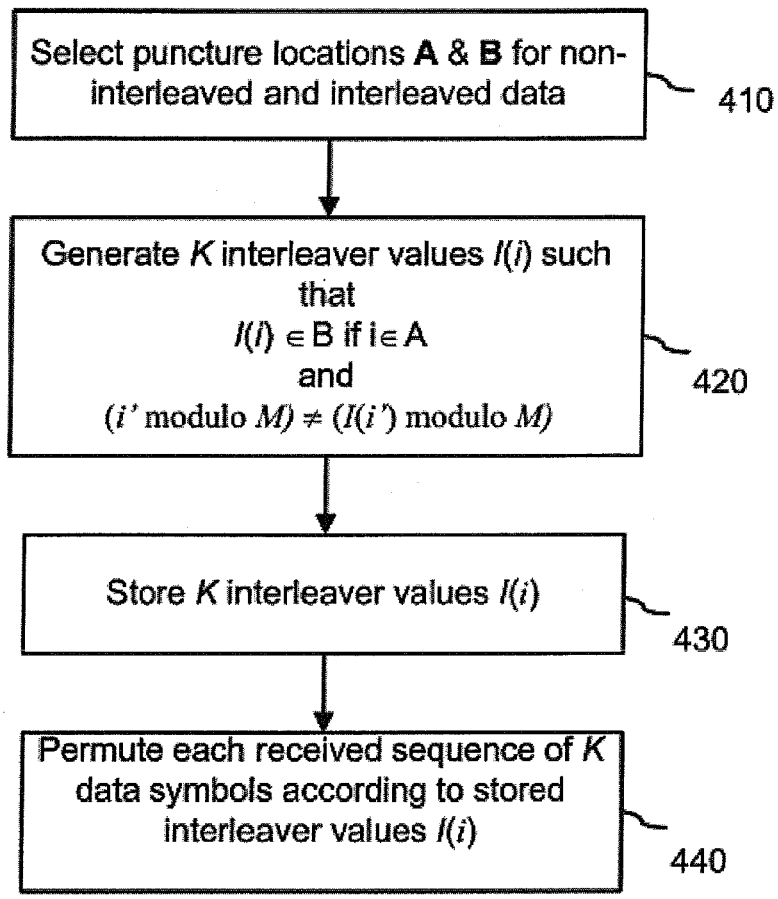
FIG. 7 is a general flowchart of the method of puncture-constrained interleaving of the present invention.

Accordingly, another aspect of the present invention provides a method of puncture-constrained interleaving for generating or decoding punctured concatenated codes having the following general steps as illustrated in flowchart of FIG. 7.

In a step 410, selecting puncture location sets A and B of desired data puncture locations in the input sequence of K data symbols d and the sequence of permuted data symbols $d_I$, respectively, wherein at least one of the puncture location sets A and B corresponds to a pre-defined puncture mask of length M.

In a step 420, generating a set of K interleaver values I={I(i)}, wherein i=0, ..., K−1, which relates symbol locations I(i) in the sequence of permuted data symbols $d_I$ to respective symbol locations i in the input sequence d of K data symbols in dependence upon the puncture location sets A and B, so as to satisfy the first and second conditions (4) and (8) given hereinabove, or, equivalently, to satisfy the following two conditions: I(i) is an element of the puncture location set B if i is an element of the puncture location set A, and (i modulo M) is not equal to (I(i) modulo M) for at least one data symbol location i=i' in the input sequence of K data symbols.

In step 430, storing the set of K interleaver values I, or information defining thereof, in memory; and, in step 440, permuting each received sequence of K data symbols according to the set of interleaver values I.

Two particular implementations of step 420 of generating the interleaver values I(i), or in other words two exemplary approaches to designing the puncture-constrained interleavers of the present invention will now be described with reference to FIGS. 8 and 9.

Figure 8:
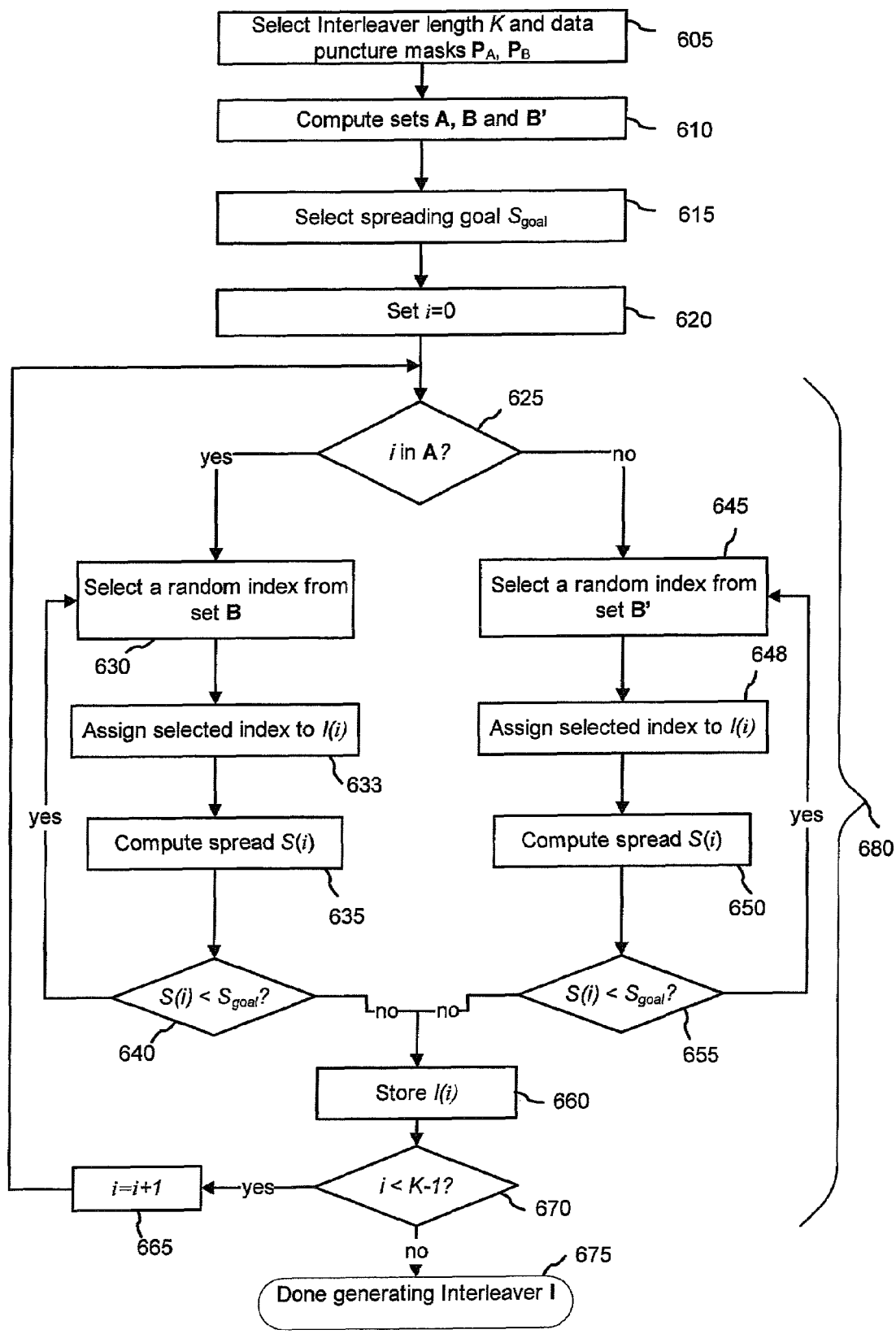
FIG. 8 is a flowchart illustrating generating a random interleaver using spread and puncture constrains.

Turning first to FIG. 8, a flowchart illustrating a first method of generating random interleavers for concatenated codes with both a high-spread constraint and the puncture constraint to match the desired data puncturing for both constituent codes. As before, a first step 605 of the process is to select the interleaver length, K, and the desired data puncture masks $P_A$ and $P_B$, for example by selecting the puncture mask parameters M, m, a and b described hereinabove. The interleaver length K is typically a multiple of the data puncture mask length, M, but this is not required. It is possible to use partial or different masks at the end, or the beginning, of the data sequences d, $d_I$ as long as the puncture location sets A and B are of the same size. The data puncture rate is m-in-M for both constituent codes. As described hereinbefore, the set a={$a_1$, $a_2$, ... $a_m$} gives the locations of the 0's in the data puncture mask used for the non-interleaved data vector d, and the set b={$b_1$, $b_2$, ... $b_m$} gives the locations of the 0's in the effective data puncture mask used for the interleaved data vector $d_I$.

Next, in a step 610 first and second sets of puncture locations A, B are computed, with the set of puncture locations A for the second code based on non-interleaved data given by a plurality {i} of all read indices i from {0, ..., K−1}, which satisfy a condition $$\mod(i,M) \in a. \qquad (9)$$

This set is illustrated at 530 in FIG. 6 by way of example for $P_A=(1010)$, K=17. Similarly, the second set of punctured locations B for the interleaved data is given by a plurality {I} of all write indices I from {0, ..., K−1}, which satisfy a condition $$\mathrm{mod}(I,M) \in b. \tag{10}$$

Turning back to FIG. 6, sets 530 and 540 illustrate by way of example the first and second puncture location sets A and B, respectively, for $P_A=(1010)$, $P_B=(1100)$, and K=17.

Once the second puncture location set B is determined, a complementary location set B', which is illustrated by way of example with a set 550 in FIG. 6, is computed. The complementary location set B' includes non-punctured locations in the sequence of permuted symbols $d_I$ and is given by a plurality {I} of all write indices I from {0, ..., K−1}, which satisfy a condition $$\mathrm{mod}(I,M) \notin b, \tag{1}$$

wherein the notation '$x \notin z$' means that x is not an element of vector z.

In a next step 615, a spreading goal for the interleaver, $S_{goal}$ is selected. Utilizing the spread constraint is preferred but optional, and can be effectively eliminated from the algorithm illustrated in FIG. 7 by setting $S_{goal}=0$.

By way of example, local and global spread parameters are computed on the basis of equations (2) and (3), but other interleaver spread definitions can also be used in other embodiments. Equation (2) gives the interleaver spread for a specific read index, i. If not all values of I(i) are defined, then it is understood that equation (2) is computed using the subset of defined values.

Next, a loop 680 is performed for read indices i=0 ... K−1, in which each symbol location i in the input sequence of data symbols d is assigned to a unique location I=I(i) in the sequence of permuted symbols $d_I$, wherein the unique location I is selected from previously not selected locations in the second puncture location set B if the symbol location in the sequence of data symbols belongs to the set A, and from the complementary location set B' comprising previously not selected locations other than locations defined by the set B, if the symbol location in the sequence of data symbols is not from the set A.

The first step 625 within the loop 680 is to test if the read index i is in the first puncture location set A. If it is, then in step 630 a random index j from the second puncture location set B is selected, and the interleaver value I(i) is set in step 633 to the selected index j, I(i)=j.

The next step 635 is to compute, utilizing for example equation (2), the spread S(i) associated with the current read index i.

In a step 640 the computed spread S(i) is compared to the selected spread goal $S_{goal}$. If S(i) is less than $S_{goal}$, then the processing returns to step 630 wherein another random index from the set B is selected. The steps 630-640 are repeated until the spreading goal is achieved. Once the condition $$S(i) \geq S_{goal} \tag{12}$$

is satisfied, in step 660 the current interleaver value I(i) is stored, and the corresponding latest selected index j is removed from the set B, thereby ensuring that all interleaver values I(i) stored in step 660 are unique.

If in step 625 it is determined that the current read index i is not an element of the first puncture location set A, then the processing turns to step 645 wherein a random index j from the complementary set B' is selected, following by steps 648 and 650 which are similar to the aforedescribed steps 633 and 635 and wherein the spread constraint (12) is tested. If the currently selected random index j is such that the computed interleaver spread S(i) is less than $S_{goal}$, then steps 645-655 are repeated; that is, another random index from the complementary set B' is drawn for the current read index i, and the selection is again tested for satisfying the spread constraint (12). Once the spreading goal is achieved, then the current interleaver value I(i) is stored in memory in a step 660, and the latest randomly selected index is removed from the complementary set B'. This ensures that all indexes in the set B' will be used once and only once.

The step 660, wherein the current interleaver value I(i) is stored in interleaver memory, finalizes one iteration of the loop 680. If in a following step 670 it is found that the current read index i is less than (K−1), then the read index i is incremented in a step 665, and a next iteration of the loop 680 is performed for a next read index i starting with the step 625 as described hereinabove.

If in the step 670 it is found that i=K−1, i.e. once all read indices from the set {0, ..., K−1} are exhausted, the process of generating the set of interleaver values I=I(i) is completed. This process finishes successfully if the spreading goal is not set too high. If it does not finish successfully in a reasonable amount of time, then the spreading goal can be reduced or the whole process as illustrated in FIG. 7 can be repeated with different random sequences until it is successful.

The aforedescribed method of generating the interleaver values I(i) using random index selection from two different sets of indices provides a puncture-constrained pseudo-random interleaver that satisfies a pre-defined minimum interleaver spread requirement, in addition to satisfying the interleaver constraints corresponding to expressions (4) and (8).

Figure 9:
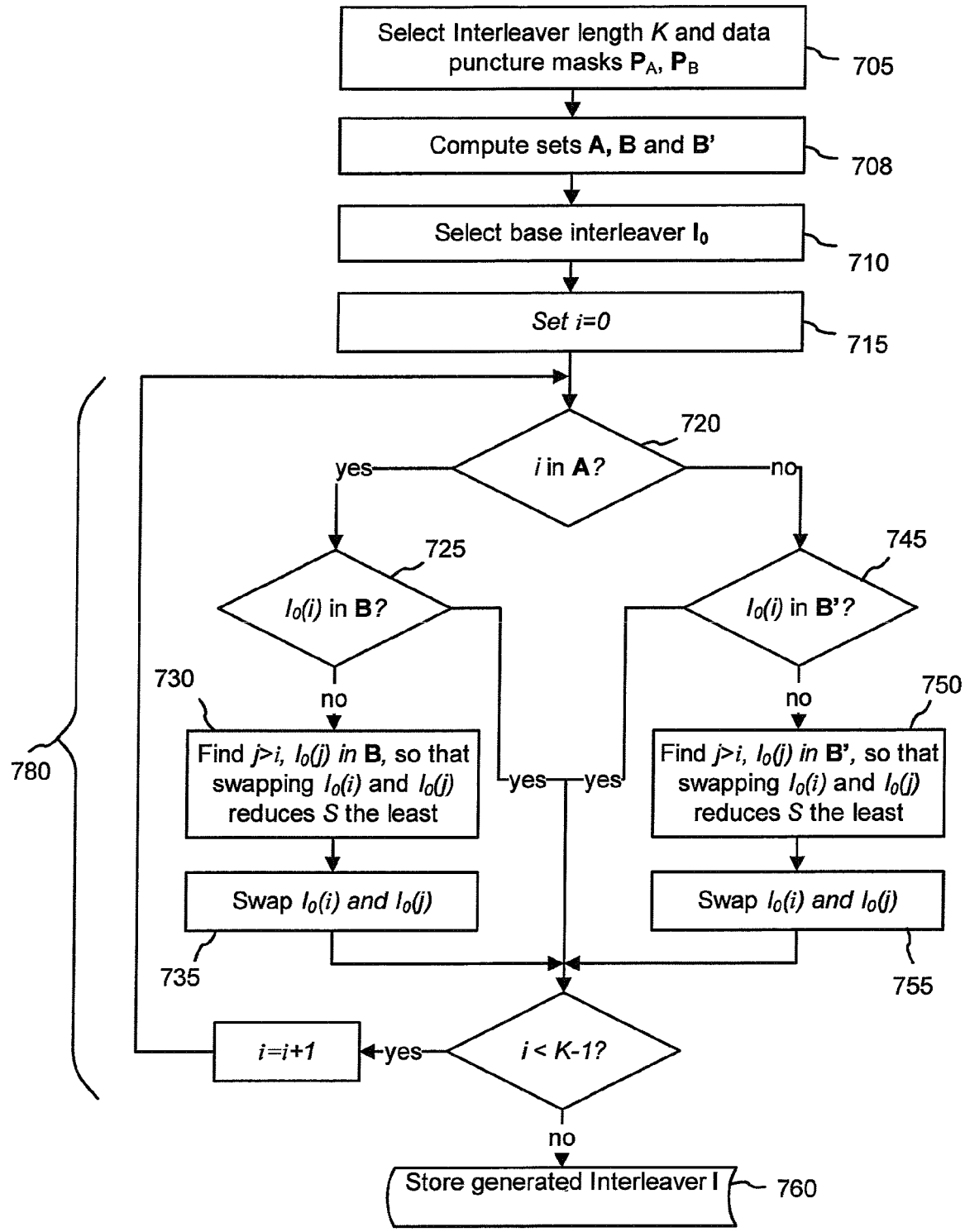
FIG. 9 is a flowchart illustrating generating a puncture-constrained interleaver using index swapping.

Turning now to FIG. 9, a flowchart is shown of another way to design puncture-constrained interleavers of the present invention, wherein desired interleaver spread or codeword distance properties are achieved by modifying a pre-selected interleaver $I_0$, also referred to herein as the base interleaver, which is known to provide the required properties.

First, the interleaver length K, the puncture masks $P_A$ and $P_B$, the first and second sets of puncture locations A and B, and the complementary location set B' are defined in steps 705 and 708, for example as it is described hereinbefore with reference to steps 605 and 610 of FIG. 8.

Next, in a step 710 a base interleaver vector $I_0$ is selected. This base interleaver $I_0$ can be generated so as to satisfy any desired pre-selected interleaving rule, such as an S-random interleaving rule, a high spread random (HSR) interleaving rule, or an interleaving rule having a repetitive structure, such as the dithered relative prime (DRP) interleaving rule, or any other suitable interleaving rule having desired properties. The base interleaver $I_0$ is then modified in an index swapping loop 780 by swapping the interleaver values, also referred to herein as interleaver indices, so that the desired puncture constraints (4) and, preferably, (8) are satisfied. Note that since the interleaver values are also referred to as interleaver indices, the swapping of interleaver values is also referred to herein as the index swapping. Note also that since the base interleaver $I_0$ is modified within the index swapping loop 780, we will be referring to the interleaver values $I_0(i)$ as the previous interleaver values $I_0(i)$ when describing operations performed in a particular iteration of the index swapping loop 780.

Within the index swapping loop 780, read indices i are sequentially selected from the set {0, ..., K−1}, starting for example from the first index i=0 in step 715, and corresponding interleaver values I(i) are obtained by modifying previous interleaver values $I_0(i)$ using the index swapping as deemed necessary. Optionally, the swapping of interleaver values is performed in dependence on the spread properties or one or more other pre-defined constraints. The exemplary embodiment described herein utilizes the overall spread S measure defined by equation (3) given hereinabove. An alternative embodiment may utilize the local spread measure S(i) defined by equation (2), which also works well and is less complex to use than the overall spread S measure, but may result in a lower overall spread S. A preferred spread measure for a particular interleaver implementation depends on the used block size K and limitations on complexity of the index swapping loop 780. The final overall spread depends on the given base interleaver and the index swapping described hereinbelow.

Each iteration of the index swapping loop 780 starts with determining if the current read index i is in the first puncture location set A. If it is, then in step 725 it is verified if a respective previous interleaver value $I_0(i)$ is an element of the second set of puncture locations B. If it is, then the previous interleaver value $I_0(i)$ is taken as a final interleaver value I(i), $I(i)=I_0(i)$, and the processing for the read index i is finished. Otherwise, in step 730 find read index j greater than i such that: 1) the previous interleaver value $I_0(j)$ is in the second set of puncture locations B, and 2) swapping the previous interleaver values, or indices $I_0(i)$ and $I_0(j)$ will reduce the overall interleaver spread S the least. In many cases, the interleaver spread S will not be reduced for several values of j, or it would be equally reduced for two or more values of j. In such cases, the j index which is closest to i can be selected, or other index selection options can be used.

In a next step 735, the found previous interleaver value $I_0(j)$ is taken as the final interleaver value I(i), $I(i)=I_0(j)$, the previous interleaver values $I_0(i)$ and $I_0(j)$ are swapped, and the processing for the read index i is finished.

If in step 720 the current read index i is not found in the first set of puncture locations A, then the processing turns to step 745, wherein it is tested if the corresponding previous interleaver value $I_0(i)$ is an element of the complementary location set B'. If it is, then the previous interleaver value $I_0(i)$ is taken as the final interleaver value I(i), $I(i)=I_0(i)$, and the processing for the read index i is finished.

Otherwise, in step 750 an index j greater than i is found such that the following two conditions are satisfied: 1) $I_0(j)$ belongs to the complementary location set B', and 2) swapping $I_0(i)$ and $I_0(j)$ will reduce the overall interleaver spread S the least, as described hereinabove with reference to step 730. In a next step 755, the previous interleaver values $I_0(i)$ and $I_0(j)$ are swapped, and the interleaver value $I_0(j)$ is taken as the final interleaver value I(i), $I(i)=I_0(j)$; this completes the processing for the read index i, and a next iteration of the loop 780 starts with step 720 for a next read index i which has not been processed previously, until all read indices i are processed as described hereinabove. At the end of the processing, the final interleaver values I(i), i=0, ..., K−1, are stored in the interleaver memory in step 760. In some embodiments, for example if the generated interleaver I has a repeating structure as described, for example, in U.S. Pat. No. 6,857,087, it may not be necessary to store all K interleaver values, but only a smaller amount of information that defines the generated interleaver as would be known to those skilled in the art.

The process described hereinabove and illustrated in FIG. 9 finishes successfully provided that the first and second puncture location sets A and B are of the same size. However, the aforedescribed index swapping process may result in a puncture-constrained interleaver having an interleaver spread that is too low for a particular application; if this is the case, then the aforedescribed process of generating interleaver values can be repeated starting with selecting a different base interleaver in the step 710, until the spread of the modified interleaver is deemed acceptable for the application.

The method described in FIG. 9 is applicable to any given base interleaver, including structured interleavers, such as the DRP interleavers. However, if a structure similar to the original given interleaver is to be maintained then the algorithm must take the structure into account. For example, if the base interleaver has a structure that repeats every L indexes and L and K are both multiples of M, then only the first L indexes need to be tested within the index swapping loop 780. And, any index swapping performed in steps 730, 735, 750 and 755 must swap sets of indexes related to the original structure of the base interleaver, not just individual indexes, so that a structure similar to the original base interleaver is maintained. If L is not a multiple of M then a structure related to the least common multiple of L and M can still be achieved in a similar manner.

Performance Results

Figure 10:
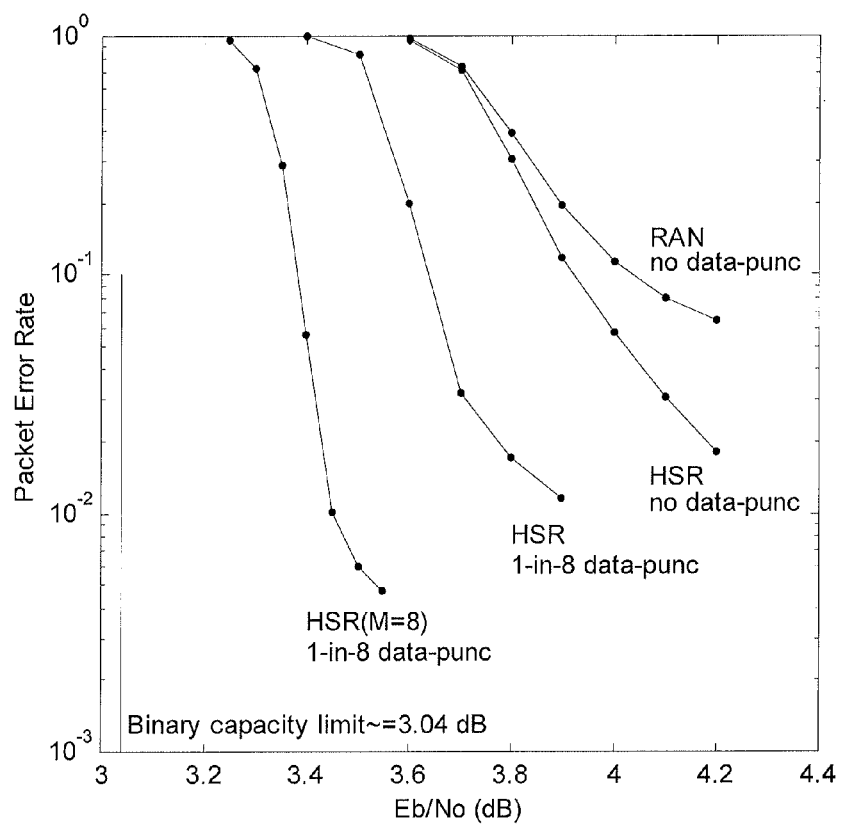
FIG. 10 is a graph showing simulated performance of the puncture-constrained interleaver of the present invention.

FIG. 10 shows the packet error rate (PER) results achieved with turbo codes that use two single-binary, 4-state, RSC constituent codes in parallel, where the feedback and feedforward polynomials are 7 and 5 in octal notation, respectively. Binary antipodal signaling and an additive white Gaussian noise (AWGN) channel were used. The signal-to-noise ratio (SNR) is measured in terms of energy per information bit, $E_b$, over the single-sided noise power spectral density, $N_0$. The interleaver size is K=57,600 bits and the punctured codeword size is N=64,800 bits. Thus, the nominal code rate with data and/or parity puncturing, in all cases, is R=K/N=8/9. The decoder used enhanced maximum-log-a-posteriori-probability (max-log-APP) processing, with scaled extrinsic information. The maximum number of decoding iterations was set to 32.

Results are shown for a typical random (RAN) interleaver with no data puncturing, a typical high spread random (HSR) interleaver with no data puncturing, the same HSR interleaver with regular 1-in-8 data puncturing for the second (non-interleaved) code, and a modified HSR interleaver, denoted as HSR(M=8), constrained so that the effective 1-in-8 data puncturing for the first (interleaved) code is also regular. With no data puncturing, only 1-in-16 parity bits are kept. With 1-in-8 data puncturing, 1-in-8 parity bits are kept, so that the overall code rate remains R=8/9. FIG. 10 shows that PER performance for the RAN interleaver is fairly poor. Performance is improved somewhat with the HSR interleaver. For the same HSR interleaver, the improvement with 1-in-8 data puncturing is significant. However, the results for the modified HSR(M=8) puncture-constrained interleaver are clearly superior to all the other results shown, both in the waterfall (convergence) and error flare regions. The reason for this significant performance improvement is because the effective data puncturing for the first, i.e. interleaved, constituent code is no longer random, but has a similar regular structure as that for the second, non-interleaved constituent code. Note that the waterfall performance for this turbo code is actually less than 0.4 dB from the binary capacity limit for a rate R=8/9 code with infinite block length. All simulation points had 300 packet errors.

The encoding method and system of the present invention utilizing puncture-constrained interleaving provides therefore considerable performance advantages compared to prior art encoders with conventional, i.e. puncture mask independent, interleavers, without requiring more complex hardware or software. Moreover, the interleaving method of the present invention is free from the limitations of the 1-bit periodic interleaver disclosed by Chatzigeorgiou et al in a paper "Punctured Binary Turbo-Codes with Optimized Performance", Proceedings of the 62nd IEEE Vehicular Technology Conference (VTC Fall 2005), Dallas, USA, Sep. 25-28, 2005, and therefore will provide better error rate and convergence performance. Indeed, utilizing the l-bit periodic interleaver of Chatzigeorgiou requires the puncture pattern B for the interleaved stream to be identical to the puncture pattern A for the non-interleaved stream. However, asymmetric turbo codes having different puncture patterns for the interleaved and non-interleaved data are known to enable better convergence than symmetric turbo codes wherein A=B. Advantageously, the present invention enables to use the puncture location sets A and B that differ from each other, for example as illustrated in FIG. 6, and therefore enables to generate asymmetric turbo codes with improved decoding convergence. Furthermore, the l-bit periodic interleaver of Chatzigeorgiou utilizes an interleaving rule which essentially requires that a data symbol position relative to a used puncture mask is preserved and not altered, and is therefore unnecessarily very restrictive in its choice of a permuted location. This in turn makes it much more difficult to find interleavers with other desirable properties such as good spread, good distance, and/or good convergence properties. Accordingly, performance results for partially systematic turbo codes shown in FIG. 7 of Chatzigeorgiou show degraded convergence performance compared to conventional interleavers and fully systematic codes at low SNRs. Contrary to that, the puncture-constrained interleaving of the present invention is free from these unnecessary limitations in selecting the permuted location for a data symbol, and therefore provides interleavers that have better interleaving spread and enables to generate codes with better codeword distance and convergence properties. Accordingly, the simulation results shown in FIG. 10 of the current application show a significant improvement at both low and high SNRs, compared to the fully systematic turbo code results.

Other Embodiments

The description hereinabove has concentrated on classical turbo codes where the two constituent codes are concatenated in parallel. That is, the data symbols permuted by the interleaver are mainly just the information bits, possibly with a few other bits such as trellis termination bits for example. However, the method and apparatus of the present invention are generally applicable to other turbo-like codes that use interleaving and puncturing of the interleaved symbols. For example, it is also applicable to serial concatenated turbo codes. In this case the puncture-constrained interleaver of the present invention permutes both the information symbols and some or all of the parity symbols from the outer encoder, and then all these permuted symbols are encoded by the first, or inner constituent code. If the outer code is non-systematic then the puncture-constrained interleaver permutes only parity symbols from the outer encoding. In any case, with the data symbols being defined in the context of this specification as those symbols permuted by the puncture-constrained interleaver, the invention can be applied to any turbo-like code to obtain regular puncturing of both the non-interleaved and interleaved data symbols.

For example, in some embodiments of the invention the number of constituent codes is more than 2, and the number of interleavers between these codes is more than one. The method of the present invention is easily extended to more than one interleaver so that regular repeating m-in-M data puncturing can be associated with two or more constituent code.

While a spread constraint of some kind is usually important for good interleaver designs, it is not required in the context of the present invention and is thus optional. Other constraints could also be applied, instead of, or in addition to, the spread constraint. For example, codeword distance testing can also be used to improve the distance properties of the overall turbo code. This in turn should improve the error flare performance of the turbo code.

The data symbols d(i) received by the encoder and permuted by the interleaver can be binary, e.g. bits, or non-binary symbols or multi-binary symbols. For example, they can be double-binary symbols used in the recent digital video broadcast—return channel satellite (DVB-RCS) standard. In one embodiment, the puncture-constrained interleaver of the present invention may include a symbol interleaver that operates on the double-binary symbols. A second level of interleaving operates on the bits within the symbols. In this case there is an equivalent overall bit interleaver, and thus the invention can be used as described hereinabove on the equivalent bit interleaver. Data puncturing can effectively be performed on the double-binary symbols or on the individual bits by specifying the appropriate puncture masks at the bit level. If two bits in the same symbol are punctured then the entire symbol is effectively punctured. For systems using non-binary symbols, the puncture-constrained interleaver would be a symbol interleaver and data puncturing would be performed on the symbols.

The present invention has been fully described in conjunction with the exemplary embodiments thereof with reference to the accompanying drawings. It should be understood that each of the preceding embodiments of the present invention may utilize a portion of another embodiment, and should not be considered as limiting the general principals discussed herein. Of course numerous other embodiments may be envisioned without departing from the spirit and scope of the invention; it is to be understood that the various changes and modifications to the aforedescribed embodiments may be apparent to those skilled in the art. Such changes and modifications are to be understood as included within the scope of the present invention as defined by the appended claims, unless they depart therefrom.

We claim:

1. A method of encoding an information-bearing signal using symbol puncturing and interleaving, the method comprising the steps of:
   a) receiving a sequence of K data symbols representing the information bearing signal, wherein K is at least 2;
   b) selecting a first puncture mask of length $D_0$ defining a puncture location set A of desired symbol puncture locations in the sequence of data symbols;
   c) selecting a second puncture mask of length D defining a puncture location set B of desired symbol puncture locations in a sequence of permuted data symbols;
   d) performing a puncture-constrained interleaving of the sequence of K data symbols for forming the sequence of permuted data symbols;
   e) encoding the sequence of permuted data symbols to obtain a first sequence of parity symbols;
   f) puncturing one of: the sequence of K data symbols according to the puncture location set A, and the sequence of permuted data symbols according to the puncture location set B, for forming a punctured sequence of data symbols; and,
   g) utilizing the punctured sequence of data symbols and the first sequence of parity symbols to obtain an encoded signal comprising error correction information;

wherein step (d) is performed so as to
  permute the first puncture location set A into the second puncture location set B, and
  alter a relative symbol position with respect to a puncture mask of length M, wherein M is the least common multiple of $D_0$ and D, for at least one of the data symbols, so that (i modulo M) is not equal to (I modulo M) for at least one data symbol location i=i' in the sequence of K data symbols and a corresponding data symbol location I=I(i') in the sequence of permuted data symbols.

2. A method of encoding according to claim 1, wherein the first and second puncture location sets A and B correspond to differing puncture masks.

3. A method of encoding according to claim 1, wherein step (d) comprises the step of assigning to each symbol location in the sequence of K data symbols a unique location in the sequence of permuted symbols, wherein the unique location is selected
  from the second puncture location set B if the symbol location in the sequence of K data symbols belongs to the set A, and
  from a complementary location set B' comprising previously not selected locations other than locations defined by the second puncture location set B, if the symbol location in the sequence of K data symbols is not from the first puncture location set A.

4. A method of encoding according to claim 3, wherein step (d) comprises utilizing a set of interleaver values I={I(i)}, i=0 ... K−1, each interleaver value I(i) defining a location in the sequence of permuted data symbols for a data symbol having a symbol location i in the sequence of K data symbols.

5. A method of encoding according to claim 4 comprising the step of generating the set of interleaver values I, which satisfies a restriction that for any symbol location i from the first puncture location set A, I(i) is an element of the puncture location set B.

6. A method of encoding according to claim 5, wherein the step of generating the set of interleaver values I comprises utilizing at least one of: a spread constraint and a distance constraint.

7. A method of encoding according to claim 5, wherein the step of generating the set of interleaver values I comprises utilizing a random or pseudo-random selection from one of the second puncture location set B and the complimentary location set B'.

8. A method of encoding according to claim 5, wherein the step of generating the set of interleaver values I comprises the step of swapping two interleaver values from a previous set of interleaver values $I_0$.

9. A method of encoding according to claim 8, wherein the step of generating the set of interleaver values I comprises the step of generating the previous set of interleaver values $I_0$ using a pre-defined interleaving rule.

10. A method of encoding according to claim 9, wherein the previous set of interleaver values $I_0$ is obtained utilizing one of an S-random interleaving rule, a high spread random (HSR) interleaving rule, and a dithered relative prime (DRP) interleaving rule.

11. A method of encoding according to claim 9, wherein the previous set of interleaver values $I_0$ is obtained utilizing an interleaving rule having a repeating structure.

12. A method of encoding according to claim 8, wherein the step of swapping two interleaver values is performed to satisfy a pre-defined constraint.

13. A method of encoding according to claim 12, wherein the pre-defined constraint is one of a spread constraint and a distance constraint.

14. A method of encoding according to claim 1, wherein the first puncture mask has the length $D_0$ =M and contains m zeros at locations defined by a set a={$a_1, a_2, \ldots a_m$}, and the second puncture mask has the length D=M and contains m zeros at locations defined by a set b={$b_1, b_2, \ldots b_m$}, where M is at least two, m is at least one, and m is less than M, and wherein elements in each of the sets a and b are unique and are selected from the set {0, 1, ... M−1}.

15. A method of encoding according to claim 14 wherein the first puncture location set A consists of all symbol locations i=0 ... K-1 for which (i modulo M) is in the set a, and the second puncture location set B consists of all symbol locations i=0 ... K-1 for which (i modulo M) is in the set b.

16. The method of encoding according to claim 1, further comprising encoding the sequence of K data symbols to obtain a second sequence of parity symbols, and wherein step (g) includes utilizing the second sequence of parity symbols in obtaining the encoded signal comprising error correction information.

17. The method of encoding according to claim 1, wherein the sequence of K data symbols comprises a second sequence of parity symbols.

* * * * *